(12) United States Patent
Williams et al.

(10) Patent No.: US 7,898,276 B2
(45) Date of Patent: Mar. 1, 2011

(54) PROBE CARD WITH STACKED SUBSTRATE

(75) Inventors: Scott R. Williams, St. George, UT (US); Bahadir Tunaboylu, Chandler, AZ (US); John McGlory, Chandler, AZ (US)

(73) Assignee: SV Probe PTE Ltd., Singapore (SG)

( * ) Notice: Subject to any disclaimer, the term of this patent is extended or adjusted under 35 U.S.C. 154(b) by 0 days.

(21) Appl. No.: 11/885,479

(22) PCT Filed: Feb. 21, 2006

(86) PCT No.: PCT/US2006/005865
§ 371 (c)(1),
(2), (4) Date: May 5, 2008

(87) PCT Pub. No.: WO2006/093704
PCT Pub. Date: Sep. 8, 2006

(65) Prior Publication Data
US 2008/0246501 A1    Oct. 9, 2008

Related U.S. Application Data

(60) Provisional application No. 60/657,487, filed on Mar. 1, 2005.

(51) Int. Cl.
*G01R 31/26* (2006.01)

(52) U.S. Cl. .................. 324/756.03; 324/755.07
(58) Field of Classification Search .................. 324/762
See application file for complete search history.

(56) References Cited

U.S. PATENT DOCUMENTS

| | | | |
|---|---|---|---|
| 6,087,840 A * | 7/2000 | Mizuta | 324/754 |
| 6,336,269 B1 * | 1/2002 | Eldridge et al. | 29/885 |
| 6,344,752 B1 | 2/2002 | Hagihara et al. | |
| 6,420,884 B1 * | 7/2002 | Khoury et al. | 324/754 |
| 6,521,479 B1 * | 2/2003 | Harrison et al. | 438/106 |
| 6,552,555 B1 * | 4/2003 | Nuytkens et al. | 324/754 |
| 7,459,795 B2 * | 12/2008 | Eldridge et al. | 257/785 |
| 2003/0127246 A1 | 7/2003 | Watanabe et al. | |
| 2004/0008044 A1 | 1/2004 | Hohenwarter | |
| 2004/0124519 A1 | 7/2004 | Zhou et al. | |
| 2004/0127074 A1 | 7/2004 | Eldridge | |

* cited by examiner

*Primary Examiner* — Ha Tran T Nguyen
*Assistant Examiner* — Roberto Velez
(74) *Attorney, Agent, or Firm* — Hickman Palermo Truong & Becker LLP; Edward A. Becker

(57) ABSTRACT

A probe card is provided including a first substrate, a second substrate, and a plurality of conductive wires extending between the first substrate and the second substrate. The conductive wires are fixed (a) at a first end to a contact of the first substrate, and (b) at a second end to a contact of the second substrate.

15 Claims, 8 Drawing Sheets

PROBE CARD WITH STACKED SUBSTRATE

CROSS-REFERENCED TO RELATED APPLICATIONS

This application claims the benefit of U.S. Provisional Application No. 60/657,487, filed Mar. 1, 2005, the contents of which are incorporated herein by reference.

FIELD OF THE INVENTION

The present invention relates to equipment for testing of integrated circuits. More particularly, the present invention relates to a probe card for wafer testing of semiconductor integrated circuits.

BACKGROUND OF THE INVENTION

In semiconductor integrated circuit manufacturing, it is conventional to test the integrated circuits ("ICs") during manufacturing and prior to shipment to ensure proper operation and related characteristics. Wafer testing is a well-known testing technique commonly used in production testing of wafer-based semiconductor ICs (or dice), wherein a temporary electrical current is established between, for example, automatic test equipment (ATE) and each IC (or die) of the wafer to demonstrate proper performance of the ICs. Exemplary components used in wafer testing include an ATE test board, which is a multilayer printed circuit board that is connected to the ATE, and that transfers the test signals back and forth between the ATE and a probe card.

An exemplary probe card includes a printed circuit board (PCB) having contacts in electrical communication with several hundred probe needles positioned to establish electrical contact with a series of connection terminals (or die contacts) on the IC wafer. Certain known probe cards further include a substrate or so-called space transformer which electrically connects the probes to the printed circuit board. The space transformer may include, for example, a multi-layer ceramic substrate or a multi-layer organic substrate. It is known to mount each of the plurality of flexible probes to a mounting surface of the space transformer. Typically, the probes are mounted to electrically conductive (e.g., metallic) bonding pads formed on the substrate through conventional plating or etching techniques well known to those of ordinary skill in the art of semiconductor fabrication. In certain alternatively configured probe cards, it is known to mount the probes within a probe head assembly which positions ends of the probes in electrical communication with contacts on the space transformer surface.

One difficulty in the fabrication of probe cards is that the mounting surface of the space transformer substrate is desirably maintained within a tight flatness tolerance, such that undesirable variation in the positions of the probe tips, which connect with the IC connection terminals, is minimized. Tight positional tolerances of all the probe tips within the probe assembly are crucial for establishing and maintaining identical contacting conditions between the individual probe tips and the terminals of the tested chips. Positional tolerances affect both the position of the probe tips relative to the corresponding terminals and the force required to establish a satisfactory electrical connection between the probes and the IC connection terminals. In order to tightly control positional tolerances of the probe tips, it is desirable that the mounting surface of the plurality of probes be as nearly planar as practicable.

In particular, one common approach for mounting probes to a substrate includes a step of using plating techniques to form a post structure on the substrate followed by a step of tab bonding each probe to a post. It is difficult to maintain the top of each of the plated posts on a common plane. Furthermore, it is difficult to maintain proper alignment of the probes as the probes are mounted to the posts.

A further disadvantage of mounting probes directly to the space transformer substrate is that the substrate tends to be a relatively expensive item, and if errors are made during the process of mounting the probes to the substrate such that the substrate is rendered useless, the cost of such errors is significant.

Thus, it would be desirable to provide a more easily manufactured and more cost-effective probe card providing probe elements having tips positioned within tight tolerances.

BRIEF SUMMARY OF THE INVENTION

According to an exemplary embodiment of the present invention, a probe card is provided including a first substrate, a second substrate, and a plurality of conductive wires extending between the first substrate and the second substrate. The conductive wires are fixed (a) at a first end to a contact of the first substrate, and (b) at a second end to a contact of the second substrate.

According to another exemplary embodiment of the present invention, a plurality of solder balls are positioned between respective contacts of the first substrate and the second substrate. The plurality of conductive wires provide first conductive paths between the first substrate and the second substrate, and the plurality of solder balls providing second conductive paths between the first substrate and the second substrate.

BRIEF DESCRIPTION OF THE DRAWINGS

For the purpose of illustrating the invention, there are shown in the drawings a form of the invention which is presently preferred; it being understood, however, that this invention is not limited to the precise arrangements and instrumentalities shown. In the drawings.

DETAILED DESCRIPTION OF THE INVENTION

Figure 1:
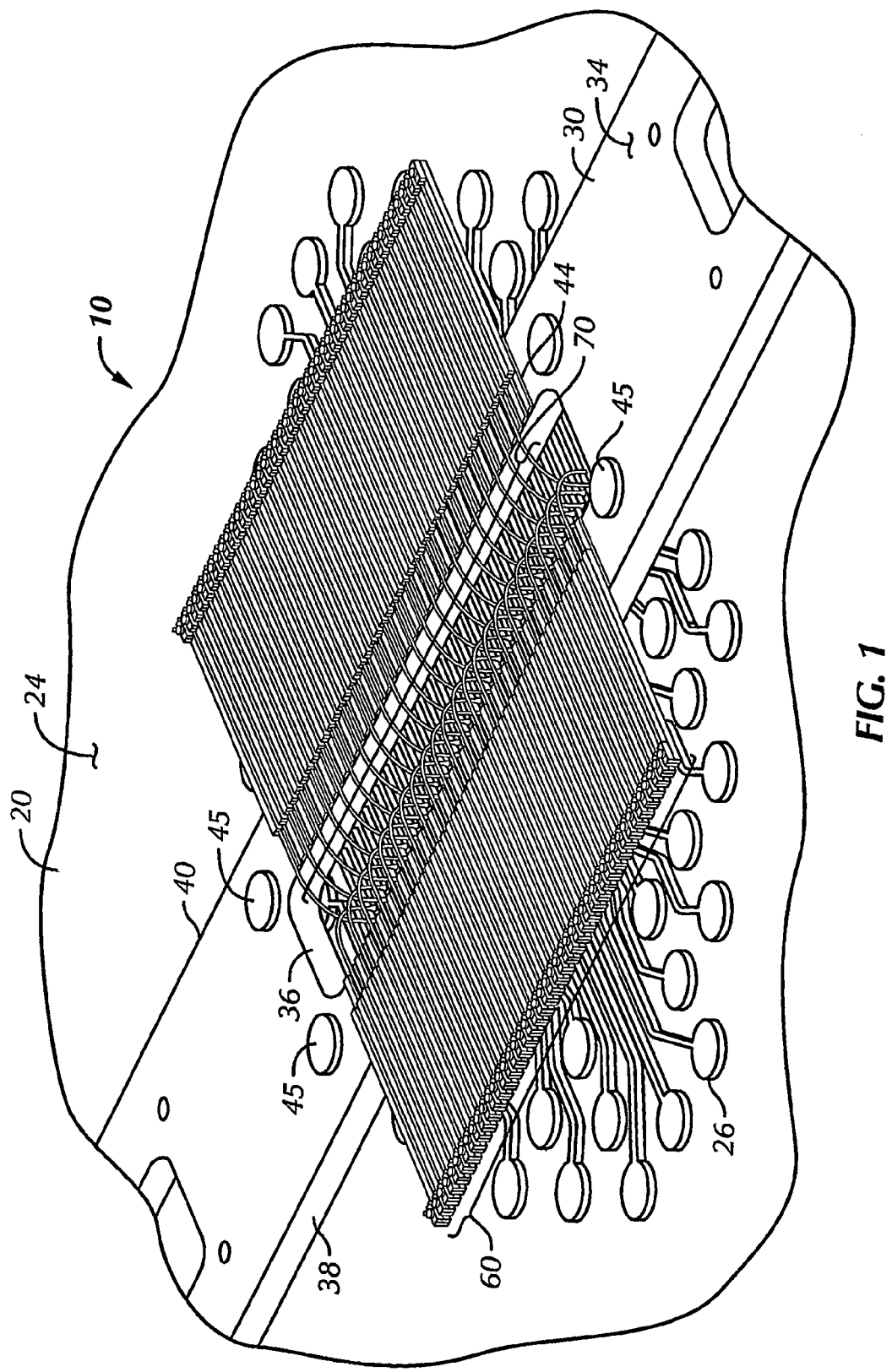
FIG. 1 is a perspective view of a portion of a probe card adapted for use with flash memory semiconductor chips and having features in accordance with an exemplary embodiment of the present invention.

As used herein, the term substrate is intended to refer to a broad range of devices (e.g., multi-layer ceramic substrates, multi-layer organic substrates, single layer substrates, printed circuit boards, interface boards (e.g., FR4 interface boards), space transformers, etc.

According to an exemplary embodiment of the present invention, a probe card for testing of semiconductor dice is provided. The probe card includes first and second substrates in a stacked arrangement. The first substrate includes a first face on which is located a first set of electrical contacts. The contacts are electrically connected to a second set of contacts formed on a second face. The electrical connection can be through any conventional means, including electrical traces and/or conductive vias.

The second substrate is located above (in the illustrated embodiments) the first substrate and includes a first face and a second face. A first set of electrical contacts is disposed on the first face. A plurality of probe elements, which in one exemplary embodiment are cantilever probes, are disposed on the first face, and at least a portion of the probes are electrically connected to the first set of electrical contacts. A plurality of electrically conductive wire bonds connect at least a portion of the first set of electrical contacts on the second substrate, to a portion of the first set of electrical contacts on the first substrate. In one exemplary embodiment, a second set of electrical contacts are formed on the second face of the second substrate. The second set of electrical contacts are electrically connected through the first substrate, such as with through vias, to a portion of the first set of electrical contacts on the first face. The second set of electrical contacts are electrically connected to a portion of the first set of contacts on the first substrate.

The foregoing and other features and advantages of the present invention will become more apparent in light of the following detailed description of the exemplary embodiments thereof, as illustrated in the accompanying figures.

Referring to FIGS. 1-4, wherein like reference numerals refer to similar elements throughout the views, exemplary embodiments of the present invention are shown for use in a probe card assembly for testing of semiconductor dice. In a first embodiment, the present invention includes stacked substrate assembly 10 with first substrate 20 and second substrate 30. Stacked substrate assembly 10 is incorporated into a probe card assembly (not fully illustrated). A plurality of probes 60 are mounted to second substrate 30 and electrically connected as discussed below to first substrate 20. In the illustrated embodiment, probes 60 are cantilever probes; however, it is understood that the teachings of the present invention may be applied to probe cards including any of a number of different probe configurations. Further, when using cantilever probes such as probes 60, a post element (not explicitly shown in FIGS. 1-4) may be provided to provide additional vertical deflection, such as the post elements illustrated in FIGS. 5A-6B.

The embodiments of stacked substrate assembly 10, 100 shown in FIGS. 1-4 illustrate two exemplary uses of the invention in memory chips. In the first illustrated embodiment (FIGS. 1 and 2), the stacked substrate assembly 10 is adapted for use with flash memory chips having electrical contacts on two lateral sides of the chip. In the second illustrated embodiment (FIGS. 3 and 4), stacked substrate assembly 100 is adapted for use with dynamic random access memory (DRAM) semiconductor chips having electrical contacts on only one side of the chip. It should be readily apparent that the illustrated embodiments are simply exemplary uses for the present invention, and should not be viewed as limiting the full scope of the invention.

Figure 2:
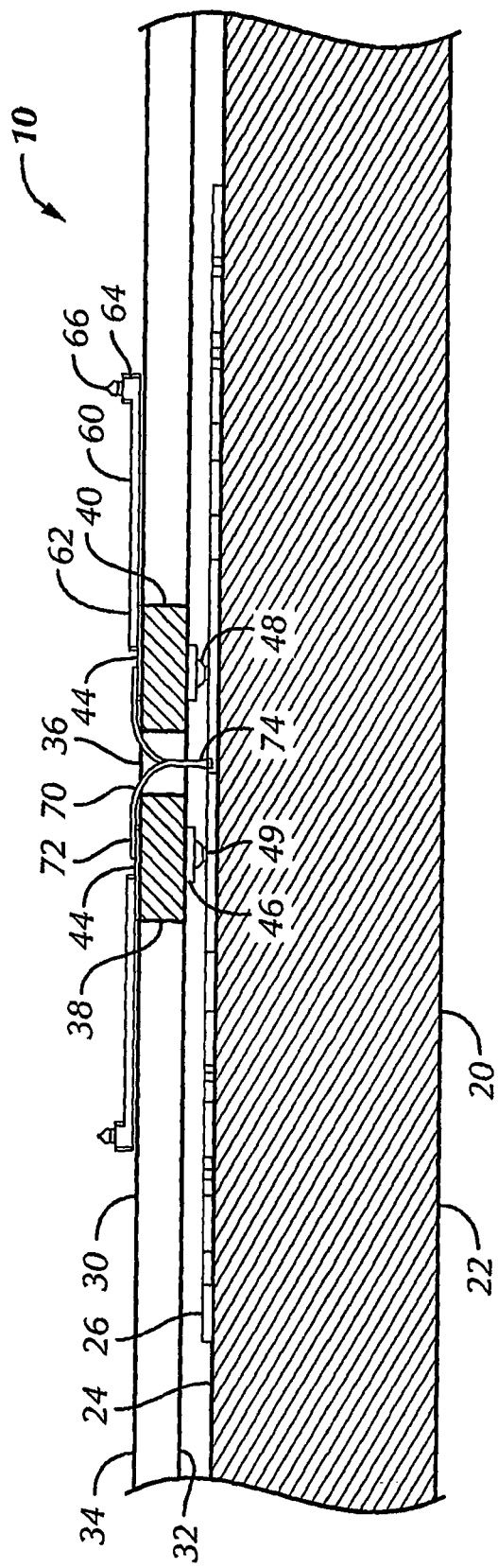
FIG. 2 is a partial side cross-section view of the probe card of FIG. 1.

Referring to FIGS. 1 and 2, stacked substrate assembly 10 includes a plurality of probes 60 that are in electrical communication with contacts, such as wire traces or contact pads (or any other type of electrical contacts such as a terminal, a lead, etc.) on first substrate 20. The electrical communication can be provided through various means. In one configuration of the invention, the electrical connection is provided through bonding of conductive wires 70 from second substrate 30 to the electrical contacts on first substrate 20. It is also contemplated that, in addition to the wire bonds, one or more probes 60 may be connected to vias that extend through second substrate 30. The vias, in turn, are connected to the electrical contacts on first substrate 20 through, for example, conductive epoxy or solder attachments and/or coined bumps. The combination of such vias and wire bonds maximizes interconnection between second substrate 30 and first substrate 20.

First substrate 20 defines first face 24 and second face 22. First substrate 20 may be, for example, a multi-layer composite of a type well known in the art of semiconductor testing and manufacturing. First set of electrical traces/contacts 26 is provided on first face 24. A set of electrical traces or contacts (not illustrated) is disposed on second face 22 and are in electrical communication with another component of the probe card assembly such as a printed circuit board (PCB), which, in turn, is in electrical communication with automated test equipment (ATE). The first and second sets of electrical traces are electrically connected through the multi-layer composite in a conventional manner, such as through a series of vias.

Second substrate 30 defines first face 34 and second face 32. Second substrate 30 may be, for example, a multi-layer composite of a type well known to a person of ordinary skill in the pertinent art. One or more central openings or slots 36 extend through the second substrate 30. Second substrate 30 defines lateral sides 38, 40.

A first set of electrical contacts 44 is disposed on first face 34 of second substrate 30. For example, electrical contacts 44 may be formed using conventional plating techniques, and may be formed, for example, from a highly conductive, oxidation resistant material such as gold. As shown in the drawings, the electrical contacts 44 may be formed as thin strips of conductive material arranged in any desired pattern.

Each probe 60 is connected to and in electrical communication with at least one electrical contact 44. In the illustrated exemplary embodiment, probes 60 are attached to a portion of the top surface of electrical contacts 44. Probes 60 have first end 62 and second end 64. Probe tip 66 is provided on probe 60 at second end 64. Probe tips 66 are positioned and adapted to contact electrical contacts on a semiconductor device under test. As indicated above, when the device under test is a flash memory chip, having two sets of electrical contacts arranged on opposing lateral sides of the chip, it is desirable to provide first and second opposing sets of probes 60. For example, probes 60 may be fabricated from a metal (e.g., tungsten, BeCu, Ni alloys, Mo, Mo alloys, Havar, etc.) having good electrical conductivity properties along with good strength and fatigue properties. Probes 60 are connected to electrical contacts 44, for example, through the use of a tab bonding process well known to those of ordinary skill in the pertinent art.

In the illustrated embodiments, probes 60 are mounted in a cantilever fashion, having a longitudinal axis extending generally parallel to first face 34 of second substrate 30 or laterally from the sides of second substrate 30. It is to be understood that stacked substrate assembly 10 could also be incorporated into a vertical probe card. Such vertical probe cards typically comprise, among other elements, a probe head and a space transformer. By applying the stacked substrate assembly concept to a vertical probe card, it would be possible to substitute the first and second substrates (with the probes attached to the second substrate) for the space transformer and probe head elements.

A plurality of second electrical contacts 46 are, for example, disposed on second face 32 of second substrate 30. For example, electrical contacts 46 are in the form of metallic contact pads which are disposed on second face 32 using conventional techniques. Second electrical contacts 46 may be electrically connected to a portion of first set of electrical contacts 44 through the thickness of second substrate 30 in a conventional manner, such as with vias (not illustrated) and/or may be electrically connected to third set of electrical contacts 45 on first face 34 of second substrate 30.

Electrically conductive connections are used to connect electrical contacts 46 on second substrate 30 with electrical traces/contacts 26 on first substrate 20 such that each probe 60 is desirably in electrical communication with at least one of electrical traces 26 on first substrate 20. Any suitable electrical connection known to those skilled in the art can be used. In the illustrated embodiment, conductive epoxy or solder bumps 48 are formed on electrical contacts 46 on second substrate 30. Bumps 48 are then connected to electrical traces 26 through coined bumps 49.

Alternatively, or in addition to, the exemplary direct bump connection discussed in the preceding paragraph, the present invention contemplates the use of a plurality of conductive wires 70 to connect first electrical contacts 44 on second substrate 30 with electrical traces 26 on first substrate 20. Wire bonds 70 provide an electrical connection between probe 60 and at least one of electrical traces 26.

Wires 70 have first end 72 bonded to electrical contacts 44 and second end 74 bonded to electrical traces 26. Wires 70 may be installed using conventional wire bonding techniques well known to artisans in the pertinent art and using conventional wire bonding machines, such as the wire bonding machines sold by Kulicke and Soffa Industries, Inc., Willow Grove, Pa. As shown in the drawings, wires 70 can be run from electrical contacts 44 on the top of second substrate 30, through slot 36 and to electrical traces 26. Wires 70 connecting cantilever probes 60 on opposite sides of slot 36 can be interleaved so as to accommodate the small spacing requirements of conventional chip designs.

Figure 3:
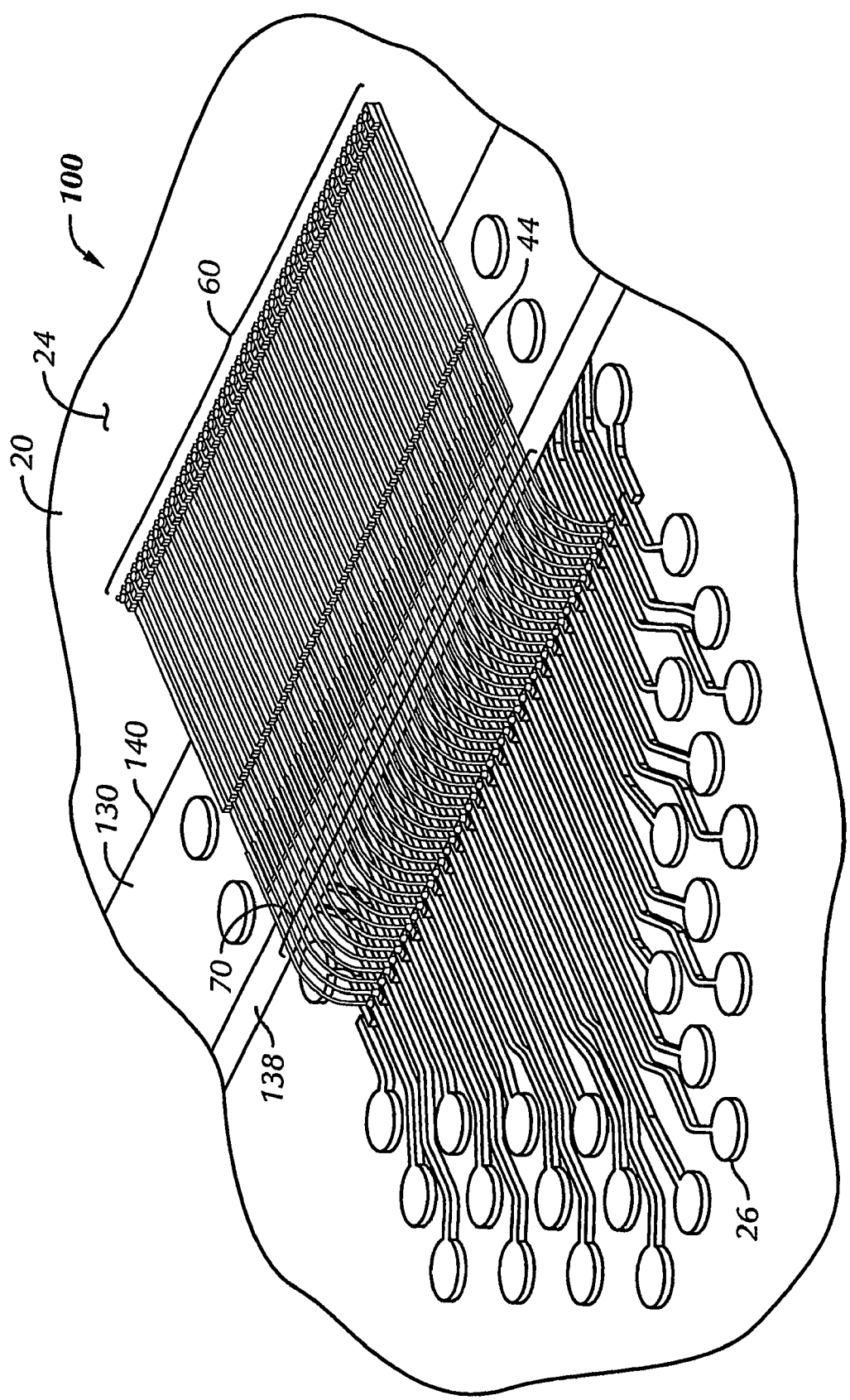
FIG. 3 is a perspective view of a portion of a probe card adapted for use with dynamic random access memory (DRAM) semiconductor chips and having features in accordance with another exemplary embodiment of the present invention.
Figure 4:
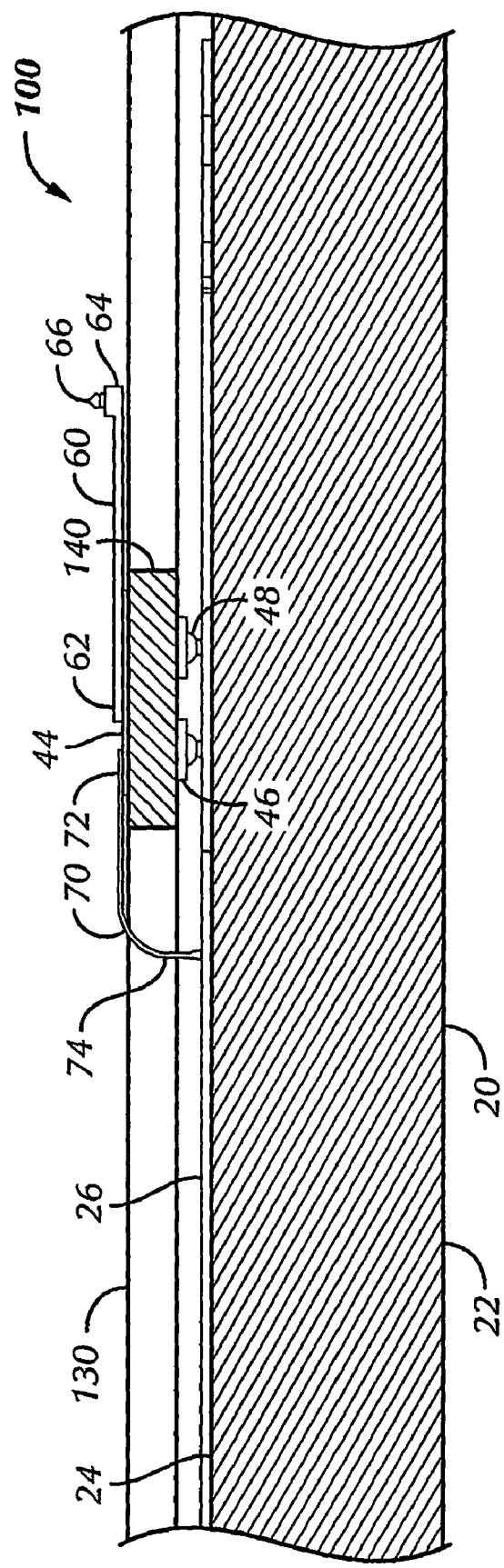
FIG. 4 is a partial side cross-section view of the probe card of FIG. 3.

With reference now to FIGS. 3 and 4, exemplary stacked substrate 100 is similar to stacked substrate assembly 10 but has certain differences such as probes 60 extending laterally from only one edge of second substrate 130 and are arranged to mate with electrical contacts characteristic of dynamic random access memory (DRAM) semiconductor chips. More specifically, stacked substrate assembly 100, second substrate 130 is used that is continuous from first edge 138 to second edge 140, without any need for intermediate slots, in stacked substrate assembly 100, wires 70 extend beyond first edge 138 and connect to electrical traces 26 on first substrate 20.

During testing of a semiconductor wafer device, probe tips 66 are moved into electrical contact with the die contacts of the semiconductor die undergoing testing. As probe tips 66 contact the die contacts, probes 60 deflect. Since probes 60 are not supported along their length except for their attachment to the second substrate, probe second ends 64 are free to deflect a significant distance.

As can be appreciated, one of the benefits provided by the present invention is that the assembly provides a small vertical package size, while providing significant deflection capability.

Additionally, the present invention provides improved control over planarity of the package since the flatness of the second substrate substantially governs the overall planarity of the package. It is significantly easier to control the flatness of the substrate than to control the plating thickness of probes. The stacked substrate also allows probe connections to be made to the relatively inexpensive second substrate rather than to the relatively expensive first substrate. Thus, if the mounting surface is damaged during the process of mounting the probes, the relatively expensive first substrate can be salvaged for re-use.

The stacked substrate thus provides for a more easily manufactured and more cost-effective probe card having probes with tips positioned within tight tolerances.

Figure 5A:
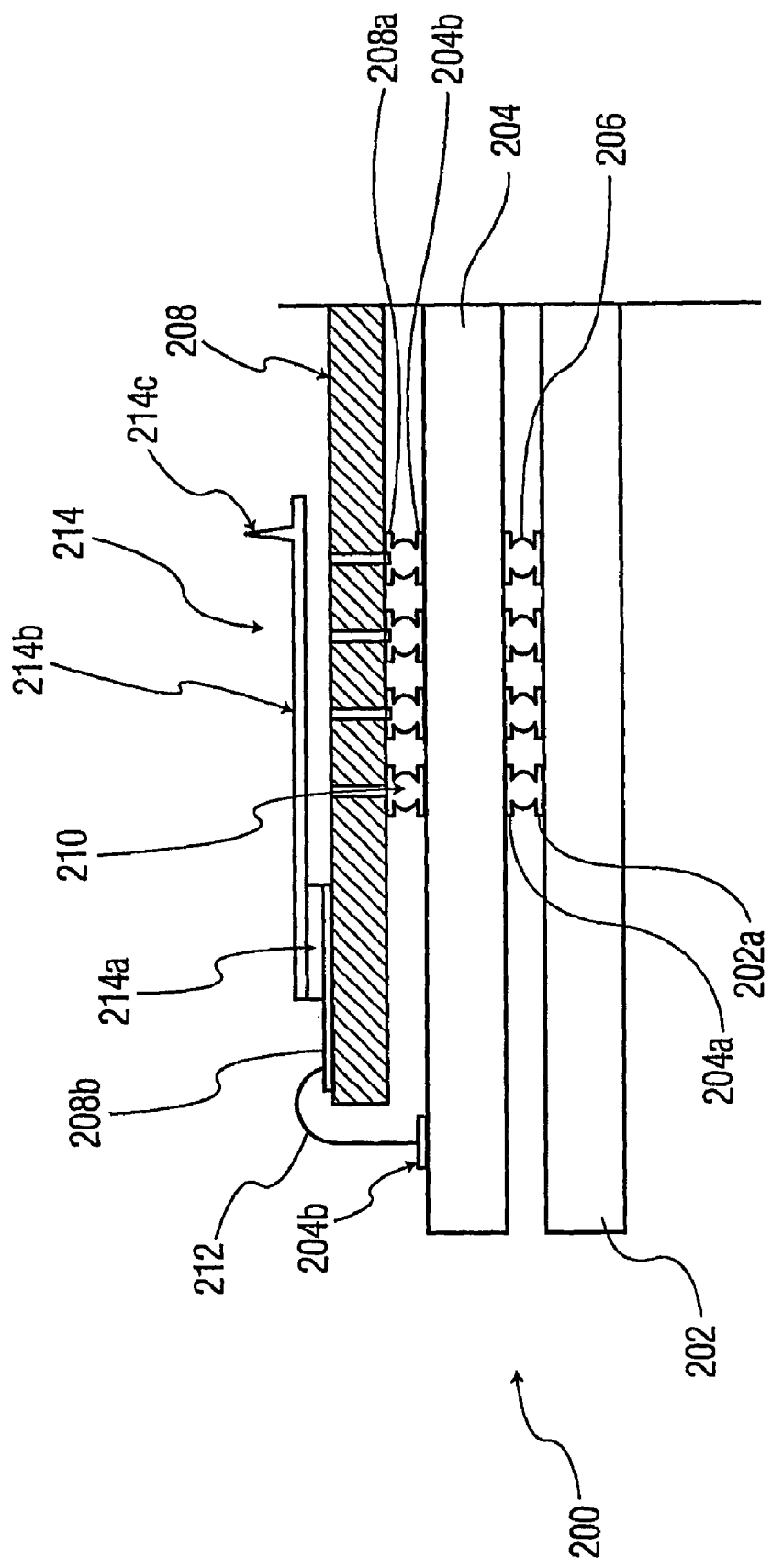
FIG. 5A is a block diagram side view of a portion of a probe card assembly in accordance with an exemplary embodiment of the present invention.

FIG. 5A is a partial side view of probe card assembly 200. Probe card assembly 200 includes printed circuit board (PCB) 202 (including contacts 202a), substrate 204 (e.g., interface board 204 including contacts 204a and 204b), and substrate 208 (including contact pads 208a and conductive traces 208b) (contact pads 208a are conductively coupled to conductive vias or the like extending through substrate 208). Only a portion of each of PCB 202, interface board 204, and substrate 208 are illustrated in FIG. 5. Conductive contact between PCB 202 and interface board 204 is provided via solder balls 206 (solder balls 206 extend between contacts pads 202a and 204a). In the exemplary configuration shown in FIG. 5A, conductive contacts between interface board 204 and substrate 208 is provided by (a) solder balls 210 (solder balls 210 extend between contact pads 204b and contact pads 208a) and (b) conductors 212 (e.g., wire bonded conductors 212) that extend between certain contact pads 204b and conductive traces 208b. Probe element 214 (including post 214a, beam 214b, and tip 214c) are conductively coupled to conductive trace 208b.

While it is not clear from FIG. 5A, conductors 212 may (or may not) extend through an aperture (not shown) in substrate 208, such as slot 36 shown in the previously described exemplary embodiments of FIGS. 1-2.

For example, in a given configuration, there may not be adequate spacing to configure all conductive connections between interface board 204 and substrate 208 using conductors 212. Thus, solder balls 210, in conjunction with conductors 212, may provide the conductive connections. For example, certain probe cards utilize probe elements arranged in various patterns/configurations on the substrate, as opposed to one or two rows of probes as illustrated in FIGS. 1-4.

Alternatively, in certain configurations, all such conductive connections may be made using conductors 212, where solder balls 210 may be used to provide mechanical strength, resiliency, and planarity between interface board 204 and substrate 208. Such solder balls 210 may extend across the entire interface length (the entire interface length is not shown in FIG. 5A) of interface board 204 and substrate 208.

Figure 5B:
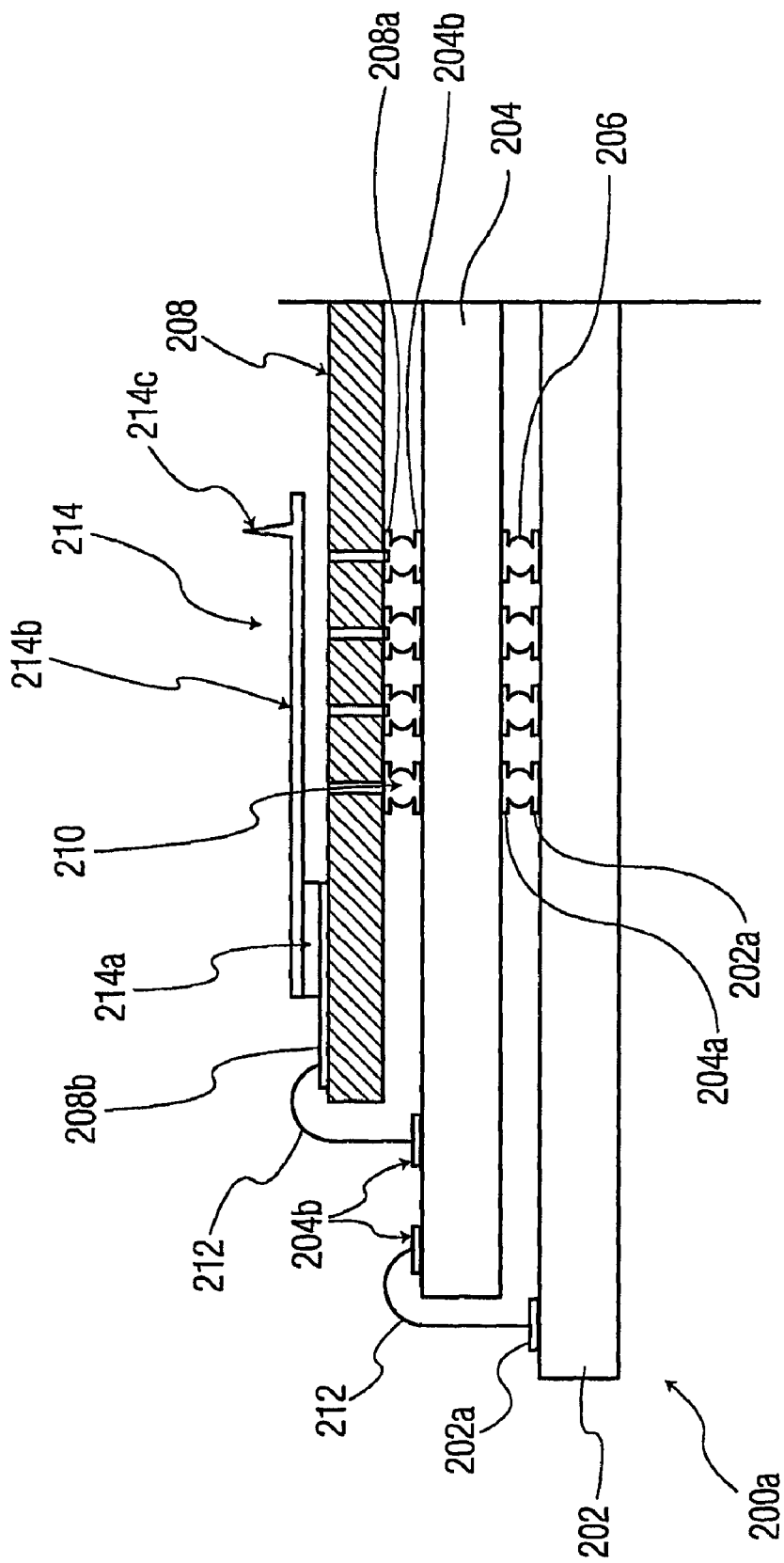
FIG. 5B is a block diagram side view of a portion of another probe card assembly in accordance with an exemplary embodiment of the present invention.

FIG. 5B is a partial side view of another probe card assembly 200a. Like reference numerals in FIG. 5B (and like elements not labeled) refer to like elements of FIGS. 5A. In probe card assembly 200a shown in FIG. 5B, a second layer of wire bonds 212 are provided. That is, wire bonds 212 are provided between PCB 202 and interface board 204 (in addition to wire bonds 212 provided between interface board 204 and substrate 208. between material 218 (e.g., an epoxy potting material) is provided to provide rigidity to wire bonds 212. Epoxy potting (or another nonconductive material) may also provide substrate-board assembly mechanical stability (e.g., stability beterrn substrate 208 and interface board 204).

Using only wire bonds 212 for connections between substrate 208 and interface board 204 in FIG. 5B may eliminate the utilization of vias in substrate 208, thereby making substrate 208 relatively inexpensive, and it may also take out certain electrical reliability risks of using vias in single-layer substrates.

Figure 6A:
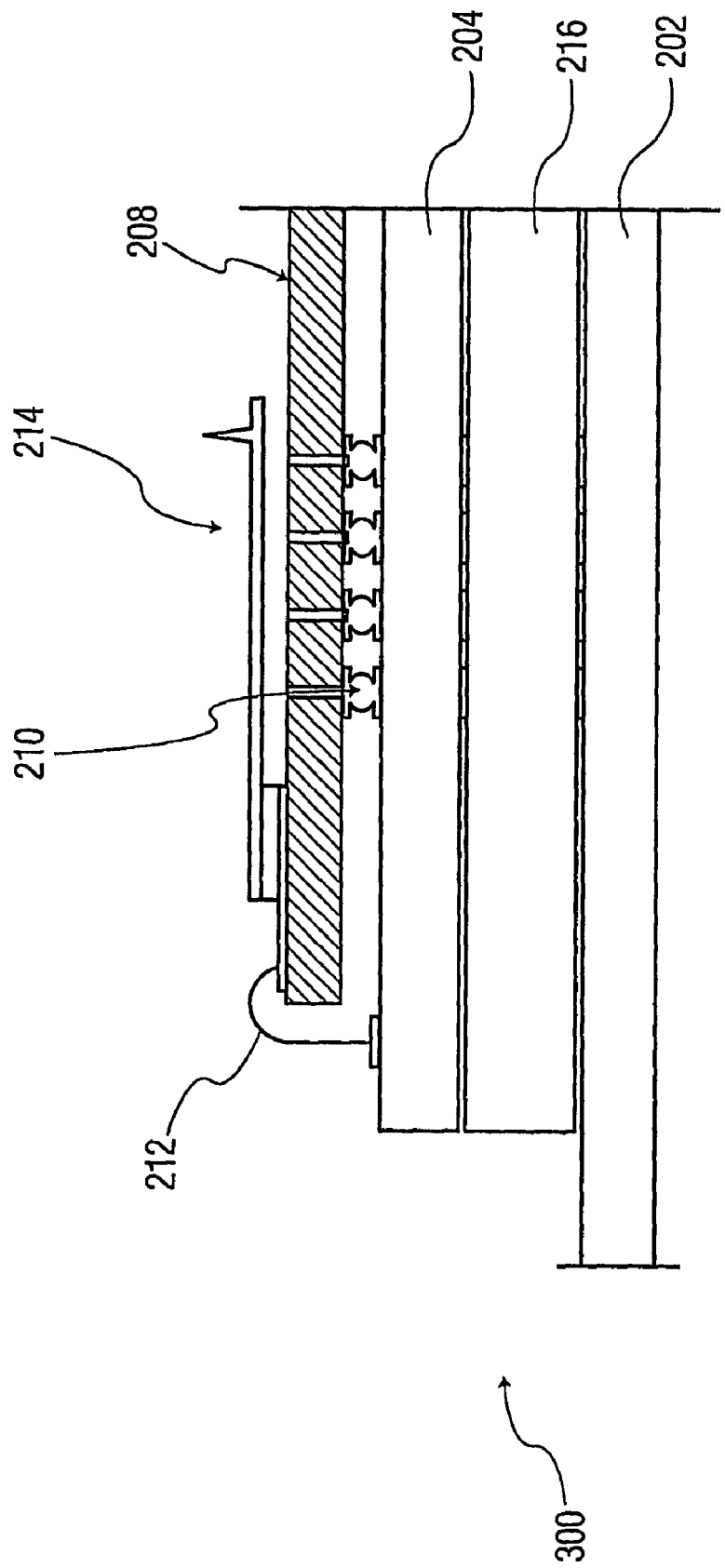
FIG. 6A is a block diagram side view of a portion of yet another probe card assembly in accordance with an exemplary embodiment of the present invention.

FIG. 6A is a partial side view of another probe card assembly 300. Like reference numerals in FIG. 6A (and like elements not labeled) refer to like elements of FIG. 5A. In probe card assembly 300 shown in FIG. 6A, interposer 216 is provided between PCB 202 and interface board 204. Interposer 216 may be any of a number of interposer types including a pogo pin interposer, a spring pin interposer, a flexible sheet supporting plated contacts, etc.

Figure 6B:
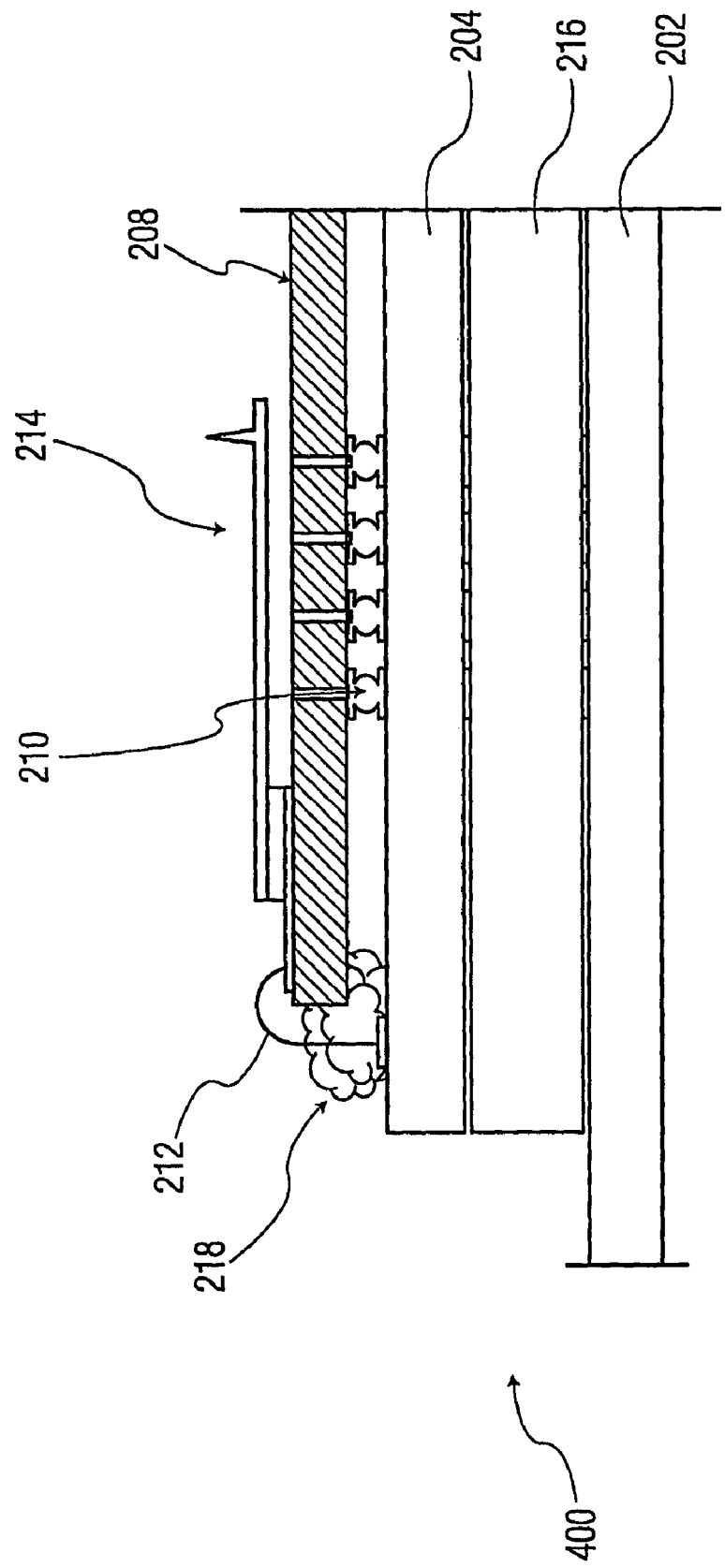
FIG. 6B is a block diagram side view of a portion of yet another probe card assembly in accordance with an exemplary embodiment of the present invention.

FIG. 6B is a partial side view of another probe card assembly 400. Like reference numerals in FIG. 6B (and like elements not labeled) refer to like elements of FIGS. 5A and 6A. In probe card assembly 400 shown in FIG. 6B, material 218 (e.g., an epoxy potting material) is provided to provide rigidity to wire bonds 212.

While the present invention has been illustrated primarily with respect to certain types of contacts on the substrates (e.g., land grid array contacts), the present invention is not limited thereto. The teachings of the present invention are applicable to substrates with any of a number of types of contacts including, for example, land grid array contact pads, ball grid array contact pads, terminals, leads, conductive traces or any other type of contact or conductive region.

The present invention may be embodied in other specific forms without departing from the spirit or essential attributes thereof. Although the invention has been described and illustrated with respect to the exemplary embodiment thereof, it should be understood by those skilled in the art that the foregoing and various other changes, omissions and additions may be made therein and thereto, without parting from the spirit and scope of the present invention.

What is claimed is:

1. A probe card comprising:
    a printed circuit board having, a plurality of electrical contacts disposed thereon;
    a stacked substrate assembly comprising:
        a first substrate having a first face with a first plurality of electrical contacts and a second face with a second plurality of electrical contacts;
        a second substrate having a first face with a first plurality of electrical contacts, a second face with a second plurality of electrical contacts and a central slot disposed through the second substrate, and
        a plurality of conductive wires attached between the first plurality of electrical contacts on the first face of the second substrate and the first plurality of electrical contacts on the first face of the first substrate, wherein the plurality of conductive wires are disposed through the second substrate in the central slot disposed through the second substrate; and
    a plurality of probe elements for making contact with a device under test, the plurality of probe elements being supported on the first face of the second substrate and in electrical contact with at least a portion of the first plurality of electrical contacts on the first face of the second substrate and wherein:
        each probe element in the plurality of probe elements includes a base end and a tip end,
        the plurality of probe elements includes a first subset of probe elements and a second subset of probe elements, and
        the first subset of probe elements is arranged so that the base ends of the probe elements in the first subset of probe elements are disposed adjacent a first side of the central slot, and
        the second subset of probe elements is arranged so that the base ends of the probe elements in the second subset of probe elements are disposed adjacent a second side of the central slot that is opposite the first side of the central slot.

2. The probe card of claim 1 wherein the plurality of conductive wires are wire bonds.

3. The probe card of claim 1 wherein the central slot disposed through the second substrate comprise an approximately rectangular slot through which the plurality of conductive wires are disposed.

4. The probe card of claim 1 additionally comprising solder ball connections between the first substrate and the second substrate.

5. The probe card of claim 1 wherein at least one of the first substrate and the second substrate is a multi-layer substrate.

6. The probe card of claim 1 wherein the plurality of probe elements is a plurality of cantilever probe elements and wherein at least one cantilever probe element of the plurality of cantilever probe elements is attached to a post element on the second substrate.

7. The probe card of claim 1 wherein each of a plurality of conductive paths for probing a semiconductor wafer are provided by way of one of the plurality of probes elements, a respective electrical contact from the first plurality of electrical contacts on the first face of the second substrate electrically coupled to the one of the plurality of probe elements, and a respective one of the plurality of conductive wires coupled between the respective electrical contact from the first plurality of electrical contacts on the first face of the second substrate and a respective electrical contact from the first plurality of electrical contacts on the first face of the first substrate.

8. The probe card of claim 7 wherein each of the plurality of conductive paths includes a resilient conductive path between the respective electrical contact from the first plurality of electrical contacts on the first face of the second substrate and a respective one of the electrical contacts from the plurality of electrical contacts disposed on the printed circuit board.

9. The probe card of claim 8 further comprising an interposer disposed between the first substrate and the printed circuit board, and wherein the resilient conductive path includes a compressible conductor of the interposer.

10. The probe card of claim 9 wherein the compressible element is a pogo pin.

11. The probe card of claim 1 wherein one or more of the plurality of probe elements are tab bonded to the first face of the second substrate.

12. The probe card of claim 11, wherein the plurality of conductive wires is a first plurality of conductive wires and the probe card further comprises a second plurality of conductive wires for electrically coupling at least a portion of the electrical contacts on the second face of the first substrate to the electrical contacts disposed on the printed circuit board.

13. The probe card of claim 1 further comprising a material for stabilizing the plurality of conductive wires, the material comprising epoxy.

14. The probe card of claim 1 further comprising an interposer disposed between the printed circuit board and the first substrate such that the interposer provides electrical interconnection between the plurality of electrical contacts disposed on the printed circuit board and the second plurality of electrical contacts on the second face of the first substrate.

15. The probe card of claim 1 wherein the plurality of conductive wires are disposed through the second substrate in the central slot disposed through the second substrate without touching side walls of the central slot.

* * * * *